United States Patent [19]
Iruka

[11] Patent Number: 5,422,441
[45] Date of Patent: Jun. 6, 1995

[54] MASTER SLICE INTEGRATED CIRCUIT HAVING A REDUCED CHIP SIZE AND A REDUCED POWER SUPPLY NOISE

[75] Inventor: Masao Iruka, Tokyo, Japan

[73] Assignee: NEC Corporation, Tokyo, Japan

[21] Appl. No.: 45,234

[22] Filed: Apr. 1, 1993

[30] Foreign Application Priority Data

Apr. 1, 1992 [JP] Japan .................................. 4-079708

[51] Int. Cl.6 .............................................. H05K 1/00
[52] U.S. Cl. .................................. 174/250; 174/268; 361/767; 361/794
[58] Field of Search ....................... 174/250, 268, 260; 361/767, 794, 772, 774; 257/41, 42, 44, 45

[56] References Cited

U.S. PATENT DOCUMENTS 4,660,174 4/1987 Takemae et al. .
4,809,029 2/1989 Matsumura et al. .
5,019,889 5/1991 Yoshio et al. .
5,038,192 8/1991 Bonneau et al. .
5,153,698 10/1992 Hirabayashi et al. .

FOREIGN PATENT DOCUMENTS 58-209158 12/1983 Japan .
1-168042 7/1989 Japan .

Primary Examiner—Leo P. Picard
Assistant Examiner—Cheryl R. Figlin
Attorney, Agent, or Firm—Young & Thompson

[57] ABSTRACT

In a master slice integrated circuit, a number of connection pads are located in a peripheral edge region of a chip in such a manner that each one power supply pad is interposed between each pair of signal input/output pads and a number of unitary pad arrays each of which consists of a signal pad, a power supply pad and another signal pad located in the named order are repeatedly arranged along a peripheral edge of the chip. Thus, the pad pitch can be reduced to two thirds of the width of an I/O cell, without changing the I/O cell size. In addition, since the power supply pad is located adjacent each of the I/O cells, it is effective to suppress or minimize the power supply voltage noise caused by the simultaneous driving.

7 Claims, 2 Drawing Sheets

MASTER SLICE INTEGRATED CIRCUIT HAVING A REDUCED CHIP SIZE AND A REDUCED POWER SUPPLY NOISE

BACKGROUND OF THE INVENTION

1. Field of the Invention

The present invention relates to a master slice integrated circuit, and more specifically to an improved location of connection pads and input/output cells in the master slice integrated circuit.

2. Description of Related Art

Master slice integrated circuits have been constructed so that a number of circuit elements such as transistors, which constitute a number of logic circuits called "internal cells", are located in the form of a matrix at a center zone of an integrated circuit chip, and a number of circuit elements, which constitute a number of input/output circuits called "I/O cells" for interfacing between the internal cells and external circuits, are arranged to surround the zone of the internal cells. A number of connection pads are located at constant intervals at a periphery of the integrated circuit chip for interconnection between the I/O cells and lead terminals of a package. In general, a width of each of the I/O cells is made equal to a pitch of the pads.

In addition, a pair of power supply wiring conductors are located to pass over all the "I/O cells", so as to form two closed loops which surround the internal cell zone. The power supply wiring conductors are connected to the pads used for the power supply.

With recent improved performance of systems using the gate arrays, further increase of the integration density and the operation speed has become required. Because of the increase of the operation speed, the power consumption has increased, and the amount of electric current flowing through the power supply wiring conductors correspondingly increases. Accordingly, a voltage drop caused at a location remote from the power supply pad because of a wiring resistance of the power supply wiring conductors has become not negligible, and therefore, it has become necessary to increase the number of power supply pads provided on a single chip. This is more remarkable in the case that ECL logic circuits are formed.

In conventional integrated circuits, the power supply wiring conductors are connected to corresponding power supply pads through conductors which extending from the power supply pads to the power supply wiring conductors. As a result, a region of the I/O cell zone adjacent to each of the power supply pads cannot be used as an element formation region since there is no signal pad, and therefore, no circuit elements are formed in the region in question, so that the region in question is left as a wasteful empty region.

With the increased number of connection pins or terminals and the increased operation speed, when a plurality of connection terminals are simultaneously driven from a low level to a high level or vice versa, a large amount of electric current flows into or out from a ground level wiring conductor. Under this circumstance, in a terminal near to the terminal whose condition has changed from the low level to the high level or vice versa, the logic voltage level exceeds a threshold (which is a boundary level between the high level and the low level) for an instant, with the result that a malfunction occurs. Namely, this simultaneous driving gives a large adverse influence. As a countermeasure for this simultaneous driving, it is necessary to strengthen the power supply wiring conductors, and it has been known to locate the power supply pads adjacent to the terminals which are simultaneously driven. Because of this, an increased number of power supply pads have become necessary. In addition, an increased number of signal pads have also become required because of the increase of the integration density. These result in an increased size of chip.

On the other hand, in order to save the cost, it is necessary to make the chip size small. However, the miniaturization of the chip size is subjected to many restrictions such as a restriction attributable to an assembling operation including a wire bonding operation and a restriction due to the size of the I/O cells. In a recent technology, in the case of using a TAB (Tape Automated Bonding) process, the pitch of pads can be shortened to 80 $\mu$m, but it rather becomes difficult to reduce the size of the I/O cells, because various functions have been required for the input/output circuits and because the current flowing through the I/O cells have become large. As a result, since the pitch of the pads is the same as the width of the I/O cells as mentioned hereinbefore, the size of the chip is determined by the width of the I/O cells.

SUMMARY OF THE INVENTION

Accordingly, it is an object of the present invention to provide a master slice integrated circuit which has overcome the above mentioned defect of the conventional one.

Another object of the present invention is to provide a master slice integrated circuit having more power supply pads but a reduced chip size, and capable of minimizing the power supply voltage noise caused by the simultaneous driving.

The above and other objects of the present invention are achieved in accordance with the present invention by a master slice integrated circuit including an internal cell zone which is defined at a center area of an integrated circuit chip and in which a number of internal cells are located in the form of a matrix, an input/output cell zone defined on the integrated circuit chip so as to surround the internal cell zone, the input/output cell zone including therein a number of input/output cells located in a single array along a side of the integrated circuit chip, a number of signal pads and a number of power supply pads located at an outside of the input/output cell zone and along a peripheral edge region of the integrated circuit chip, each of the input/output cells being connected to a corresponding one of the signal pads, and at least one power supply wiring conductor located to pass all the input/output cells and therefore to surround the internal cell zone, the at least one power supply wiring conductor being connected to the power supply pads, the signal pads and the power supply pads being arranged in such a manner that each one power supply pad is interposed between each pair of adjacent signal input/output pads and a number of unitary pad arrays each of which consists of a signal pad, a power supply pad and another signal pad located in the named order are repeatedly arranged along a peripheral edge of the integrated circuit chip.

The above and other objects, features and advantages of the present invention will be apparent from the following description of preferred embodiments of the

DESCRIPTION OF THE PREFERRED EMBODIMENTS

Figure 1A:
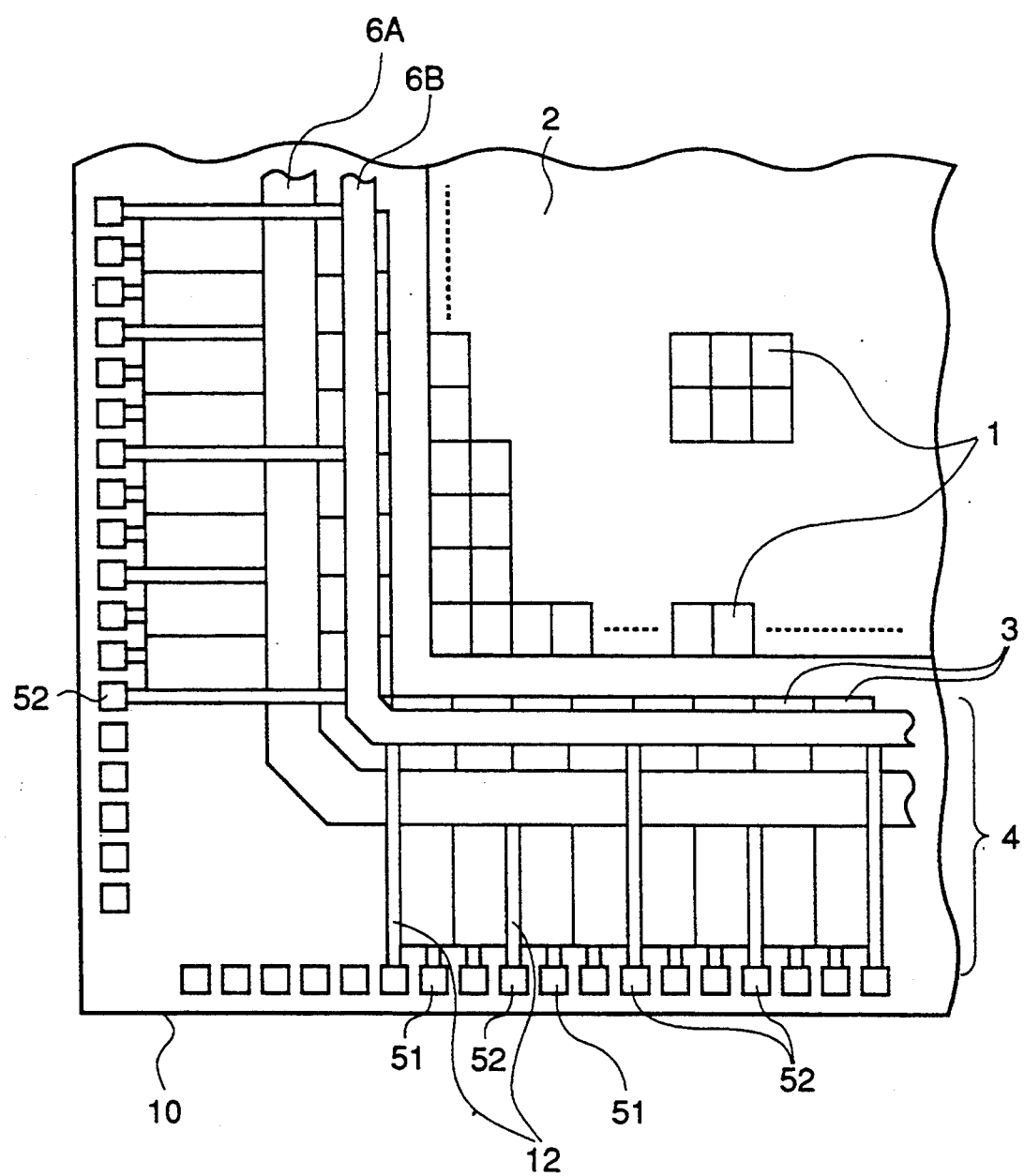
FIG. 1A is a partial layout pattern diagram of a first embodiment of the master slice integrated circuit in accordance with the present invention.
Figure 1B:
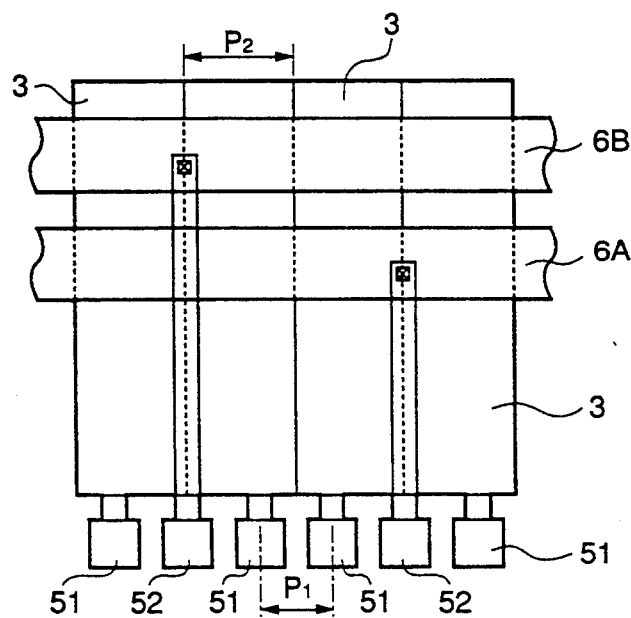
FIG. 1B is an enlarged layout pattern diagram of a portion of the I/O cell zone in the master slice integrated circuit shown in FIG. 1A.

Referring to FIG. 1A, there is shown a partial layout pattern diagram of a first embodiment of the master slice integrated circuit in accordance with the present invention. An enlarged layout pattern diagram of a portion of the I/O cell zone in the shown master slice integrated circuit is shown in FIG. 1B.

The first embodiment of the master slice integrated circuit in accordance with the present invention includes an internal cell zone 2 which is defined at a center area of an integrated circuit chip 10 of a rectangular shape and in which a number of internal cells 1 is located in the form of a matrix. An I/O cell zone 4 is defined so as to surround the internal cell zone 2, and in the I/O cell zone 4, a number of I/O cells 3 are located to form a single array extending along each side of the rectangular chip 10. In addition, a number of signal pads 51 and a number of power supply pads 52 are located outside of the I/O cell zone 4 so as to form a single array extending along a peripheral edge region of the chip 10. Pads including the signal pads 51 and the power supply pads 52 are arranged at the same pitch. Each of the I/O cells 3 is connected to a corresponding one of the signal pads 51. A pair of power supply wiring conductors 6A and 6B are located to pass over all the I/O cells 3 and therefore to surround the internal cell zone 2. For example, one of the power supply wiring conductors 6A and 6B is for a positive or negative voltage, and the other is for a ground level.

In the shown embodiment, the signal pads 51 and the power supply pads 52 are located in such a manner that each two signnal pads 51 are located at each side of each power supply pads 52, namely, each two signal pads 51 and one pwer supply pad 52 are alternately located along a peripheral edge of the chip 10. In other words, a number of unitary pad arrays, each of which consists of one signal pad 51, one power supply pad 52 and another signal pad 51 located in the named order, are repeatedly arranged along a peripheral edge of the chip 10. In addition, the power supply pads 52 themselves are alternately connected to the power supply wiring conductors 6A and 6B through draw-out conductors 12 each extending from one power supply pad 52 to a corresponding one of power supply wiring conductors 6A and 6B along a boundary line between a pair of adjacent I/O cells 3 as shown in detail in FIG. 1B. Therefore, if odd-numbered power supply pads 52 are connected to the power supply wiring conductor 6A, even-numbered power supply pads 52 are connected to the power supply wiring conductor 6B.

In the above mentioned arrangement, since one power supply pad 52 and the draw-out conductor 12 connected thereto are located at one or the other side of each I/O cell 3, it is possible to suppress or minimize the adverse influence of the simultaneous driving. The reason for this is that the driving current flowing through the I/O cell can be efficiently supplied or drawn through the power supply pad 52 by an external power supply, and therefore, it is possible to minimize the voltage drop which would otherwise occur in the power supply wiring conductors.

In addition, as will be understood from FIG. 1B, the width $P_2$ of each I/O cell can be made one and a half times of the pitch $P_1$ of the pads 51 and 52. Therefore, the I/O cells can have a wider width.

In the case of a master slice integrated circuit designed for the TAB assembling, the pad pitch and the I/O cell width are designed to be on the order of 80 μm in order to reduce the chip size. In assembling such a chip into a package, the pad pitch has to be expanded to 100 μm because of a limit attributable to the wire bonding. In this case, the internal cell zone is not modified, but the I/O cell zone must be modified or newly designed. According to the present invention, when the pad pitch is 100 μm, the I/O cell width can be made to 150 μm. In this case, since the I/O cell width can be expanded, the length of the I/O cell can correspondingly be reduced, with the result that the chip size can be also reduced.

Figure 2:
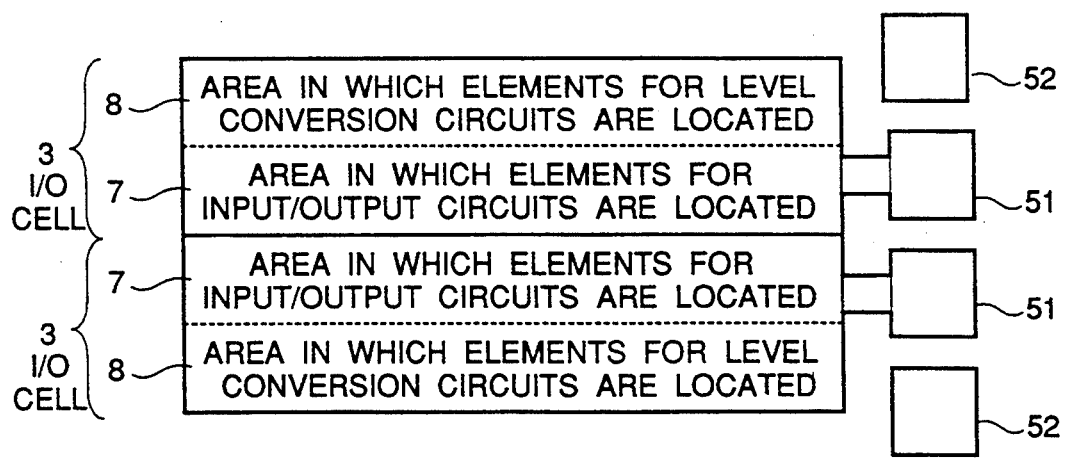
FIG. 2 is an enlarged partial layout pattern diagram of a portion of the I/O cell zone in a second embodiment of the master slice integrated circuit in accordance with the present invention.

Alternatively, as shown in FIG. 2 which shows an enlarged partial layout pattern diagram of a portion of the I/O cell zone in a second embodiment of the master slice integrated circuit in accordance with the present invention, the 150 μm width of the I/O cell can be divided to a first area having a width of 80 μm in which circuit circuit elements for an input/output circut for the TAB are located, and a second area having a width of 70 μm in which circuit elements for a level conversion circuit, a boundary scan circuit, a test circuit, or the like are located. Therefore, a pair of adjacent input/output cells 3 shown in FIG. 2 are constructed in such a manner that the circuit blocks 7 and 8 included in one of the pair of adjacent input/output cells are located in symmetry to the circuit blocks 8 and 7 included in the other of said pair of adjacent input/output cells. Accordingly, it is a matter of course that it is possible to construct the pair of adjacet input/output cells 3 in such a manner that all circuit elements included in one of the pair of adjacent input/output cells are located in symmetry to all circuit elements included in the other of said pair of adjacent input/output cells.

With this arrangement, a multi-function of I/O cells can be advanced.

As will be apparent from the above, according to the present invention, each power supply pad is interposed between each pair of signal input/output pads, and a number of unitary pad arrays, each of which consists of a signal pad, a power supply pad and another signal pad located in the named order, are repeatedly arranged along a peripheral edge of the chip. Thus, the pad pitch can be reduced to two thirds of the pad pitch of the conventional integrated circuit, without changing the I/O cell size. In addition, since a power supply pad is located adjacent each of the I/O cells, it is effective to suppress or minimize the power supply voltage noise caused by the simultaneous driving.

The invention has thus been shown and described with reference to the specific embodiments. However, it should be noted that the present invention is in no way limited to the details of the illustrated structures but changes and modifications may be made within the scope of the appended claims.

I claim:

1. A master slice integrated circuit including:
   an internal cell zone which is defined at a center area of an integrated circuit chip and in which a number of internal cells are located in the form of a matrix;
   an input/output cell zone defined on said integrated circuit chip so as to surround said internal cell zone, said input/output cell zone including therein a number of input/output cells located in a single array along a side of said integrated circuit chip;
   a number of signal pads and a number of power supply pads located in a row at an outside of said input/output cell zone and along a peripheral edge region of said integrated circuit chip, each of said input/output cells being connected to a corresponding one of said signal pads; and
   at least one power supply wiring conductor located to pass over all said input/output cells and therefore to surround said internal cell zone, said at least one power supply wiring conductor being connected to said power supply pads,
   each power supply pad being disposed in-line with a boundary line between each pair of adjacent signal input/output pads, and two signal pads being disposed between each pair of consecutive power pads along a peripheral edge of said integrated circuit chip.

2. A master slice integrated circuit claimed in claim 1 wherein said signal pads and said power supply pads are arranged at a constant pitch.

3. A master slice integrated circuit claimed in claim 1 wherein said the pitch of said signal pads and said power supply pads is two thirds of the width of said input/output cells.

4. A master slice integrated circuit claimed in claim 1 wherein said at least one power supply wiring conductor is connected to said power supply pads through draw-out conductors each extending from one power supply pad to said power supply wiring conductor and overlying said boundary line between a pair of adjacent input/output cells.

5. A master slice integrated circuit claimed in claim 1 wherein a pair of power supply wiring conductors are located to pass over all said input/output cells and therefore to surround said internal cell zone, and wherein said power supply pads are alternately connected to each of said pair of power supply wiring conductors through draw-out conductors each extending from one power supply pad to a corresponding one of said pair supply wiring conductors overlying said boundary region between each pair of adjacent input/output cells.

6. A master slice integrated circuit claimed in claim 1 wherein at least one pair of adjacent input/output cells are constructed in such a manner that circuit blocks included in one of said pair of adjacent input/output cells are located symmetrically relative to circuit blocks included in the other of said pair of adjacent input/output cells.

7. A master slice integrated circuit as claimed in claim 1, wherein said input/output cells are contiguous.

* * * * *